United States Patent [19]
Bourgeois et al.

[11] Patent Number: 5,965,957
[45] Date of Patent: Oct. 12, 1999

[54] SWITCHING APPARATUS, IN PARTICULAR FOR SYSTEMS UNDER TEST

[75] Inventors: Jean-François Bourgeois, Vanves; Patrick Grain, Mehun Sur Yevre; Jean-Louis Lach, Levallois Perret; Patrick Petit, Allouis, all of France

[73] Assignee: AEROSPATIALE Societe Nationale Industrielle, Paris, France

[21] Appl. No.: 08/891,183

[22] Filed: Jul. 10, 1997

[30] Foreign Application Priority Data

Jul. 10, 1996 [FR] France .................................. 96 08596

[51] Int. Cl.$^6$ .................................................. G01R 31/28
[52] U.S. Cl. .......................... 307/116; 307/112; 324/73.1; 371/22.1; 371/27.5; 395/311
[58] Field of Search ..................... 307/112, 116; 324/73.1; 371/22.1, 27.5; 395/311

[56] References Cited

U.S. PATENT DOCUMENTS

| | | | |
|---|---|---|---|
| 4,300,207 | 11/1981 | Eivers et al. ............................. | 395/311 |
| 4,348,759 | 9/1982 | Schnurmann ........................... | 371/22.1 |
| 4,488,299 | 12/1984 | Fellhauer et al. . | |
| 5,047,708 | 9/1991 | Konder .................................. | 324/73.1 |
| 5,101,150 | 3/1992 | Sullivan . | |
| 5,194,758 | 3/1993 | Ver Meer ............................... | 307/112 |
| 5,426,361 | 6/1995 | Simmons .............................. | 324/73.1 |

FOREIGN PATENT DOCUMENTS

| | | |
|---|---|---|
| A-0056895 | 8/1982 | European Pat. Off. . |
| A-0063650 | 11/1982 | European Pat. Off. . |
| A-0710910 | 5/1996 | European Pat. Off. . |

*Primary Examiner*—Albert W. Paladini
*Attorney, Agent, or Firm*—Frishauf, Holtz, Goodman, Langer & Chick, P.C.

[57] ABSTRACT

Switching apparatus for automatically interconnecting a first unit with a second unit, the apparatus having a first input/output assembly connected to the first unit and a second input/output assembly connected to the second unit, and including both at least one switch card each provided with at least one switch element, and a control unit for the card for establishing or not establishing interconnections between the first and second units as a function of determined instructions issued to said control unit, the control unit also including means for enabling the physical configuration of said switching apparatus to be input, and means suitable, once said input has been performed, for automatically interconnecting the first unit with the second unit in accordance with the instructions issued to the control unit by a user.

8 Claims, 3 Drawing Sheets

SWITCHING APPARATUS, IN PARTICULAR FOR SYSTEMS UNDER TEST

FIELD OF THE INVENTION

The present invention relates to switching apparatus for making or breaking links between two units provided with input/output assemblies, and in particular making it possible to control or monitor systems under test such as electronic equipments, electronic cards, or electronic components.

PRIOR ART

Present switching apparatuses are mainly constituted by relay switch cards or, in some special applications, by switch cards using semiconductor devices such as switching transistors. These various cards are controlled by programming the cards individually, e.g. from a computer unit, using a specific control syntax defined by the manufacturer for each type of card. This gives rise to very great difficulty in programming, in particular when the switching apparatus is complex and includes several tens of switch cards coming from different manufacturers and thus having different control syntaxes. The programmer has no assistance in ensuring the integrity of the various switched links, and after programing has been completed, actually running the system under test is the only way of genuinely verifying that the programming has been done correctly and thus guaranteeing that the test is performed correctly.

OBJECT AND BRIEF SUMMARY OF THE INVENTION

The present invention seeks to provide switching apparatus that considerably simplifies the work of initial programming, and in particular that avoids the need for testing to be performed at the end of programming on a real setup, since that is a common source of damage to the system under test. An object of the invention is to provide apparatus that is reliable and that can be used by any user without any need to know the control syntax for each switch card making up the apparatus. Another object of the invention is to provide switching apparatus which itself takes account of short circuits and of various dependency relationships that may exist between the switch elements making up each card. Yet another object of the invention is to enable the switching apparatus to be controlled automatically after programming has been performed.

These and other objects of the present invention are attained by a switching apparatus for automatically interconnecting a first unit with a second unit. The apparatus includes at least one switch card which is provided with at least one switch element. Each switch card has a plurality of inlets and a plurality of outlets coupled to one of (i) another card via connection plates, (ii) the first unit via a first input/output assembly, and (iii) the second unit via a second input/output assembly. A control unit on the switch card controls whether interconnections are established or not established between the first and second units as a function of determined instructions issued to the control unit. The control unit includes means for inputting interconnection links which enable (i) interconnection between the cards, (ii) interconnection between the switch elements, (iii) interconnection between any of the cards and the first unit, and (iv) interconnection between any of the cards and the second unit. The control unit also includes means suitable, once input of the interconnection links has been performed, for automatically interconnecting the first unit with the second unit in accordance with instructions issued to the control unit by a user. Each switch card also includes a memory which stores a state of each switch element of the card. The memory is readable from the control unit via a common bus.

By separating the function of programming (completely defining the physical configuration of the apparatus), which is performed once and for all for a given switching apparatus, from the function proper of performing user commands (e.g. performing a test when the second unit is a system under test), it is possible to achieve automatic control and optimization of user commands, so the user can then think of the switching apparatus merely as a "black box".

Advantageously, the means for interconnecting the first and second units include means for verifying that user instructions are compatible with the previously input physical configuration of the switching apparatus. The verification means include, in particular, means for verifying that said interconnections do not give rise to short circuits within the switching apparatus. The risk of destroying the second unit (e.g. the system under test) is thus avoided.

The means for inputting the physical configuration of the switching apparatus include means for inputting the control syntaxes of said switch cards, means for inputting the links interconnecting said switch elements of said switch cards, and means for inputting the interconnection links of said switch cards with one another and with said input/output assemblies. This achieves full modelling of the switching apparatus so the user need only specify the links that are to be established between the input/output assemblies (there is no need to specify links internal to the switching apparatus).

The means for inputting the links interconnecting said switch elements include means for establishing dependency relationships between at least two determined ones of said switch elements so as to ensure that they are operated simultaneously, whether in phase or out of phase. Similarly, the means for inputting the links interconnecting said switch cards include means for establishing dependency relationships between at least two determined ones of said links so that they are established either simultaneously or mutually exclusively.

Preferably, the control unit also includes means containing at least one library of basic functions for facilitating said inputting.

BRIEF DESCRIPTION OF THE DRAWINGS

Other characteristics and advantages of the present invention appear more clearly from the following description given by way of non-limiting indication and with reference to the accompanying drawings, in which.

DETAILED DESCRIPTION OF A PREFERRED EMBODIMENT

Figure 1:
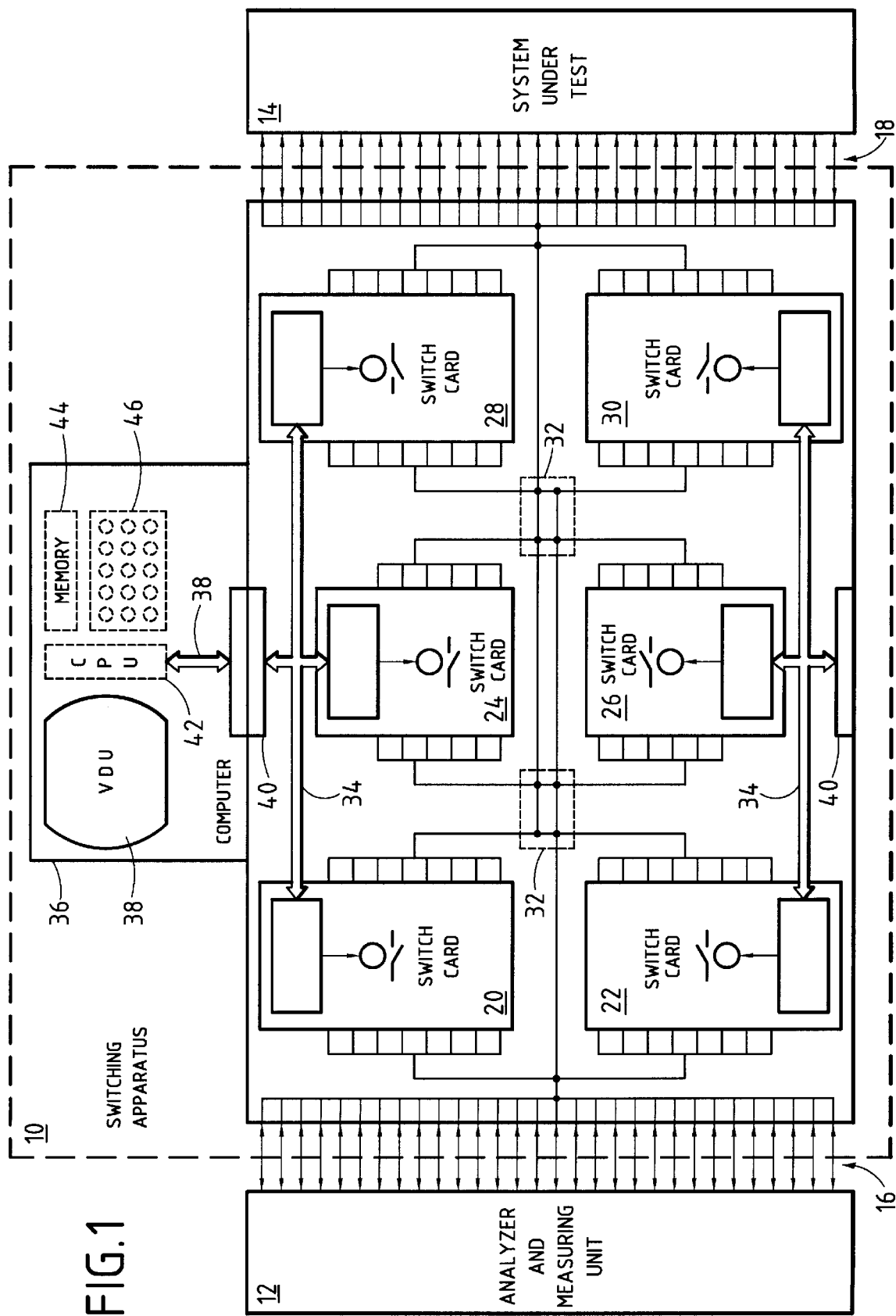
FIG. 1 is a block diagram of switching apparatus of the invention for controlling a system under test.

FIG. 1 is a diagram of switching apparatus of the invention. The switching apparatus 10 is provided to set up links between a first unit such as an analyzer and measuring unit 12, and a second unit such as a system under test 14 (also referred to as a system to be tested). The system under test may be of any kind, for example it may be a complex electronic system such as an aviation system, or electronic equipment such as a test rack, an electronic card, or even an electronic component. The analyzer and measuring unit may comprise any type of analyzer or measuring device including power supplies, low or high frequency signal generators, bus analyzers, oscilloscopes, frequency meters, multimeters, counters, etc.

The apparatus of the invention may also be implemented e.g. for providing a switch unit, in particular when making use of transistor switch elements (acting as the system under test) for switching telemetry signals delivered by various aviation systems and picked up by an acquisition assembly (acting as the measuring unit).

The analyzer measuring unit 12 is connected to the switching apparatus 10 via a first input/output assembly 16, and the switching apparatus is itself connected to the system under test 14 via a second input/output assembly 18.

The switching apparatus 10 comprises a plurality of switch cards (e.g. six cards 20 to 30 as shown in FIG. 1), each card having a plurality of inlets and a plurality of outlets connected directly to the first or second input/output assemblies, or indeed connected to one another via connection plates 32, and serving to make or break links between the measuring unit 12 and the system under test 14, as a function of determined instructions received via a common communications bus 34 to which all of the switch cards are connected. These various instructions are generated in a computer control unit 36 advantageously constituted by a personal type computer (e.g. an IBM PC) or a workstation (e.g. of the kind provided by the American companies Hewlett-Packard and Sun) or any other analogous processor machine. The control unit is connected directly to the common bus 34 via its own internal bus 38 at a link interface 40 (conventionally the interface is constituted by a slot in the "motherboard" of the computer) and includes in conventional manner means 42, memory means 44, data input means such as a keyboard 46, and data output means such as a display screen 48.

Figure 2:
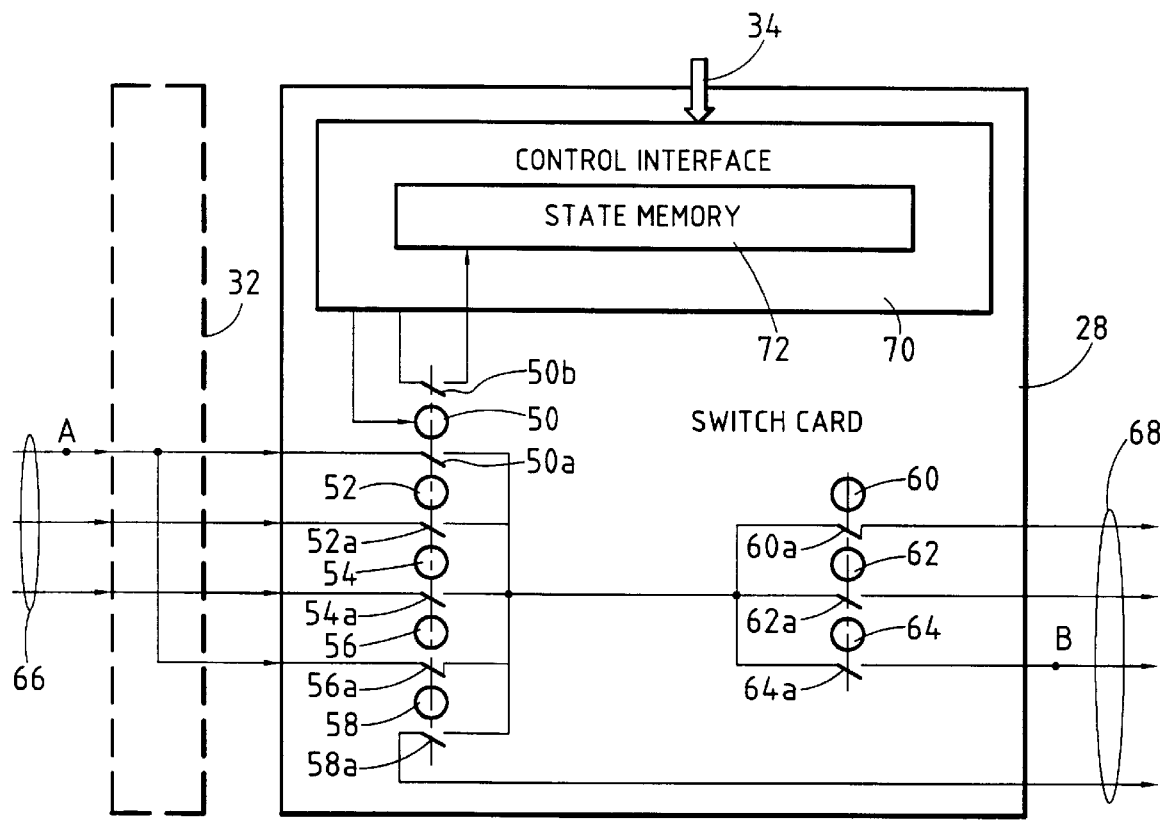
FIG. 2 shows a switch card of the apparatus of FIG. 1.

FIG. 2 shows more precisely the structure of a switch card, e.g. the card referenced 28. This card has at least one switch element 50 to 64 provided with at least one contact 50a to 64a for providing a link between inputs 66 (possibly via a connection plate 32) and outputs 68. Naturally, any type of contact can be envisaged: a one- or two-pole contact, or a double contact, for example, of the type that is open or closed at rest, and indeed any type of card can be used: a simple relay card, a matrix card, a multiplexer card, a transistor card. Tektronix, Racal Systems, and Hewlett-Packard are the main suppliers of cards of this type. Each switch element is controlled individually via a control interface 70 which is connected to the common bus 34 either by transferring characteristics of the address-data type or else by reading/writing in a specific register of the interface. Advantageously, the control interface includes a memory 72 which stores the open or closed state of each switch element of the card by reading the state of a transfer device which may be an auxiliary contact associated with each of the elements (to avoid overcrowding the drawing, only one auxiliary element 50b is shown).

Figure 3:
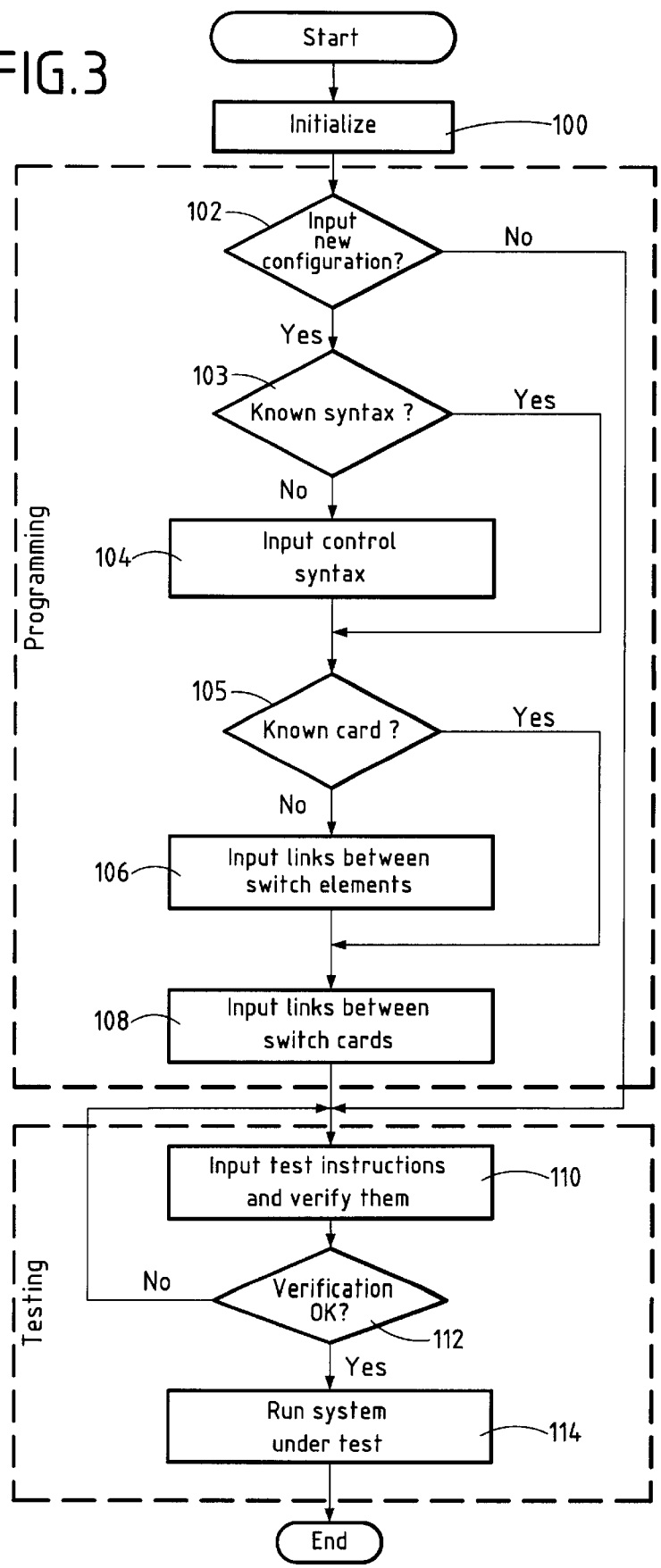
FIG. 3 is a flow chart explaining the various steps of programming and controlling the switching apparatus of FIG. 1.

The operation of the switching apparatus of the invention is described below with reference to FIG. 3. This operation comprises essentially two portions that are separate and that take place in succession: a first portion (programming or modelling portion) in which the physical configuration of the switching apparatus is input, i.e. the configuration of its various components (cards and switch elements, connection plates), together with the links between these components, and a second portion (e.g. an execution portion for running a test proper) in which the apparatus is controlled.

After an initialization step 100, a request is made for initial input (or modification) of the physical configuration of the switching apparatus in step 102, and then there follows a step 104 at the control unit 36 (e.g. using its input and processing means) during which the control syntaxes of the various switch cards used in the apparatus are input. It is known that these syntaxes depend both on the type of card used (the syntax for a relay card is different from that of a multiplexer card, for example), and, naturally, on the card manufacturer. Inputting such syntaxes requires information about various parameters for identifying the card to which the syntax is to be applied, for recovering a possible error code, for initializing the card in full, and for specifying the commands for putting each of the switch elements of the card into the working state or into the rest state. General parameters relating to the date of this first input, to any subsequent revision thereof, and to its identity are naturally also provided. A library of predetermined control models (basic functions) is available, and may possibly make it possible during a prior test step 103 to avoid inputting syntax if the control syntax is already known. It should be observed that syntaxes can, in theory, be input once and forever, and subsequent inputting is justified only in the event of a new card manufacturer appearing or in the event of existing manufacturers changing their original syntax (which is rare because they try to maintain compatibility between ranges).

Once this step of inputting the various available syntaxes has been completed, the method can move on to the following step 106 of inputting the interconnection links between the various switch elements of a given card. This further input is performed in similar manner via the control unit 36 and consists in defining, for each card, its input points, its output points (external), and its connection points (internal) that are referred to as "ports", and the various paths possible between these points or ports, which are referred to as "lengths". It is also necessary to define the dependency links between the various lengths when, for example, activation (or deactivation) of one of the lengths must give rise to one or more other lengths being activated. With this information available, it is then possible to know which lengths can or cannot be activated simultaneously, thereby ensuring that any short-circuiting is avoided. Naturally, and as before, provision is made for inputting general parameters concerning the switch card such as its identity, the date of input, its revision date, if any, the manufacturer's reference, and the syntax and the type of communications bus used with the card. Switch cards presently on the market implement various different types of bus, and in particular the following buses: IEEE, MXI, VXI, and GPIB. Similarly, a library of card models (basic functions) is also accessible in a prior step 105 making it possible, where necessary, and when the card used is already known, to omit this inputting step. It will be understood that except when integrating new types of switch card, this inputting step does not need to be repeated on each occasion that the switching apparatus is used.

Thereafter, in a step 108, the interconnection links that may be established between the switch cards are input via the control unit 36. Unlike the preceding links, these links differ depending on the system under test. As before, ports are defined, but so also are connections between all the inputs/outputs of the switching apparatus, which connections, like the lengths, may be given dependency relationships that can cause them to be activated together or on the contrary can make them mutually exclusive. General parameters of identification, creation dates, revision index, and number of cards concerned together with the address given to each card are also input.

Once the above control syntaxes, links between switch elements, and links between switch cards have all been input, or in the event of no creation or modification of a physical configuration for the apparatus of the invention is requested in step 102, it is then possible in a step 110 to enable the user to run a test proper, by issuing the commands required to perform it (i.e. by issuing all the appropriate test instructions). It is very important to observe that although the above input steps 104 to 108 require the competence of a programmer, that does not apply to the step of running a test which can be performed by any user of the switching apparatus. In the past, the user had to issue commands, one after another, for all of the relays necessary for establishing a link between an input of the switching apparatus and an output thereof, whereas now the user merely needs to mention which input needs to be connected to which output. This new control process is illustrated very simply with reference to FIG. 2. In prior art switching apparatuses, in order to connect input A to output B, it was necessary to give the following three instructions in succession: open C28, 56 (open relay 56 on card 28); close C28, 50; close C28, 64. With the switching apparatus of the invention, a single instruction "connect A to B" enables the same link to be established. This example is deliberately simple, but the advantage of the invention will readily be understood when the switching apparatus has several tens of cards each having more than ten switch elements. Under such circumstances, the time saving for the user is considerable. And above all the user does not need to be a specialized programmer knowing the hardware structure of each switch card and the control syntax specific thereto. The various commands necessary for testing are issued by the user via the input means 46, and the switching apparatus makes use of its processor module 42 to verify that the instructions given can indeed be performed in a step 112, and whether it is in a position genuinely to run such instructions in a final step 114. This new aspect of the invention is also of great importance, since unlike prior art switching apparatus, where the programming performed by the programmer is verified while performing a real test (thus giving rise to very significant risks of the system under test being destroyed, which happens frequently in practice), the present invention makes it possible for the test instructions input by the user to be subjected to preliminary verification in the control unit 36, as a function of the previously-input physical configuration of the switching apparatus. It is only after the instructions have been validated, and only after it has been verified that the various interconnections do not give rise to short circuits within the apparatus, that a real test can be run.

As a result, the reliability of the apparatus is considerably increased and any risk of destroying the system under test is completely eliminated. It will be observed that the switching apparatus of the invention is very simple for users to use both with respect to implementation (programming is facilitated by making use of predefined libraries or functions) and with respect to running the apparatus (particularly by optimizing the commands given to the various switch cards).

We claim:

1. Switching apparatus for automatically interconnecting a first unit with a second unit, the apparatus having at least one switch card each provided with at least one switch element, each said card having a plurality of inlets and a plurality of outlets coupled to one of (i) another card via connection plates, (ii) the first unit via a first input/output assembly, and (iii) the second unit via a second input/output assembly, and a control unit for the card for establishing or not establishing interconnections between the first and second units as a function of determined instructions issued to said control unit, wherein the control unit comprises means for inputting interconnection links which enable any of (i) interconnection between said cards, (ii) interconnection between switch elements, (iii) interconnection between any of said cards and said first unit, and (iv) interconnection between any of said cards and said second unit, and means suitable, once input of said interconnection links has been performed, for automatically interconnecting the first unit with the second unit in accordance with instructions issued to the control unit by a user; and wherein each said card comprises a memory which stores a state of each switch element of the card, said memory being readable from the control unit via a common bus.

2. Use of the switching apparatus according to claim 1, to controlling a system under test, such as an electronic subassembly, from an analyzer and measuring unit.

3. Switching apparatus according to claim 1, wherein said means for interconnecting the first and second units include means for verifying that the user instructions are compatible with the previously input interconnection links of the switching apparatus.

4. Switching apparatus according to claim 3, wherein said verification means include, in particular, means for verifying that said interconnections do not give rise to short circuits within the switching apparatus.

5. Switching apparatus according to claim 1, wherein said means for inputting the interconnection links of the switching apparatus include means for inputting control syntaxes of said switch elements of said switch cards, and means for inputting the interconnection links of said switch cards with one another and with said input/output assemblies.

6. Switching apparatus according to claim 5, wherein said means for inputting the links interconnecting said switch cards include means for establishing dependency relationships between at least two determined ones of said links so that they are established either simultaneously or mutually exclusively.

7. Switching apparatus according to claim 5, wherein said means for inputting the links interconnecting said switch elements include means for establishing dependency relationships between at least two determined ones of said switch elements so as to ensure that they are operated simultaneously, whether in phase or out of phase.

8. Switching apparatus according to claim 7, wherein said control unit also includes means containing at least one library of basic functions for facilitating said inputting.

* * * * *